US 6,650,203 B2

(12) United States Patent
Gerstenberg et al.

(10) Patent No.: US 6,650,203 B2
(45) Date of Patent: Nov. 18, 2003

(54) FILTER ARRANGEMENT

(75) Inventors: Bruno Gerstenberg, Owingen (DE); Hans-Joachim Michling, Überlingen (DE); Helmut Messmer, Volkertshausen (DE)

(73) Assignee: Diehl Avionik GmbH, Überlingen/Bodensee (DE)

( * ) Notice: Subject to any disclaimer, the term of this patent is extended or adjusted under 35 U.S.C. 154(b) by 0 days.

(21) Appl. No.: 09/812,433

(22) Filed: Mar. 20, 2001

(65) Prior Publication Data
US 2001/0024148 A1 Sep. 27, 2001

(30) Foreign Application Priority Data
Mar. 21, 2000 (DE) .......................................... 100 13 936

(51) Int. Cl.[7] ................................................. H03H 7/01
(52) U.S. Cl. ........................ 333/185; 333/204; 333/246
(58) Field of Search ............................... 333/185, 184, 333/181, 204, 246, 247

(56) References Cited
U.S. PATENT DOCUMENTS
4,843,356 A * 6/1989 Lusignan et al. ........... 333/236
5,165,055 A * 11/1992 Metsler ..................... 333/12
5,525,953 A * 6/1996 Okada et al. ............... 333/204
5,532,658 A * 7/1996 Tonegawa et al. .......... 333/246
5,815,052 A * 9/1998 Nakajima et al. ........... 333/175
6,225,570 B1 * 5/2001 Ishiyama et al. ........... 174/260

FOREIGN PATENT DOCUMENTS
DE  38 23 469 A1  1/1990 .................. 333/185
DE  196 30 720 A1  2/1998 .................. 333/185

* cited by examiner

Primary Examiner—Seungsook Ham
(74) Attorney, Agent, or Firm—Scully, Scott, Murphy & Presser

(57) ABSTRACT

The invention relates to a filter arrangement for separating radio frequency energy from signal energy in a signal line. The signal line extends at least partly in a first layer of a multi-layer printed circuit board. A grounded surface is arranged in a second layer of the printed circuit board. The signal line to be filtered is interrupted in the first layer in the filter region and continued in a third layer, the second and the third layers being located on opposite sides of the first layer. Due to the skin effect the radio frequency energy will be concentrated on the side of the signal line facing the grounded surface. The side of the signal line remote from the grounded surface is then to a large extent decoupled from radio frequency energy, such that the actual signal path can be continued without being disturbed by radio frequency energy.

7 Claims, 2 Drawing Sheets

FILTER ARRANGEMENT

BACKGROUND OF THE INVENTION

The invention relates to a filter arrangement for separating radio frequency energy from signal energy in a signal line in a multi-layer printed circuit board.

Electronic components in many electronic devices have to be protected against electromagnetic influences. This can be effected by filter arrangements.

DE 38 23 469 A1 discloses a filter arrangement for filtering a plurality of lines which are guided in a housing from a chamber containing electromagnetic fields through a partition to a device provided in a shielded chamber. The partition is constituted by a multi-layer printed circuit board. The printed circuit board comprises a continuous intern grounded surface which is electrically connected to the housing and has openings acting as signal feed-through means, through which through pieces are passed. Filter components are mounted on the printed circuit board. The through pieces form a capacitor with the grounded surfaces, though which high frequency signals are deviated to ground. The opening is very narrow, such that no disturbing fields can pass there through into the shielded chamber.

DE 196 30 720 A1 discloses a filter arrangement for separating a region containing radio frequency fields from a region shielded from radio frequency fields. The filter arrangement is provided along a separating surface in a multi-layer printed circuit board arranged in a metal housing. The separating surface extends transversely to the planes of the layers of the printed circuit board. Grounded metal surfaces are provided along the separating surface in layers which are separated by an intermediate layer. Strip conductors pass through the separating surface in the intermediate layers. Conductive areas are formed in these strip conductors in the region of the separating surface, these conductive areas together with the grounded surfaces forming filter capacitors for shunting radio frequency fields. In the region of the separating surface the housing is divided into two chambers by a partition. EP 0 688 158 A1 discloses a similar filter arrangement.

SUMMARY OF THE INVENTION

One of the objects of the present invention is to provide a very simple filter arrangement for separating radio frequency energy from signal energy on a signal line in a printed circuit board.

Another object of the invention is to provide a filter arrangement which is able to effectively filter out high radio frequencies in signal lines.

According to one feature of the invention, the signal line to be filtered extends at least partly in a first layer of the multi-layer printed circuit board, a grounded surface is arranged in a second layer of the printed circuit board, the signal line to be filtered is interrupted in the first layer in a filter region and continued in a third layer of the printed circuit board, the second and third layers being located on opposite sides of the first layer.

The invention is based on the idea to makes use of the skin effect for separating radio frequency energy from low frequency signal energy. According to the skin effect, a high frequency current is not evenly distributed over the total cross section of a conductor, but is concentrated at the surface of the conductor. This is caused by the inner self-induction. Thus, with high frequencies, radio frequency currents just flow in a thin surface layer of the conductor such that the area of the corresponding electric circuit is minimized. This effect can be observed in solid conduit shields (tubes) in which the transimpedance increases when the frequency is increased, because, due to the skin effect, the radio frequency disturbance current flows more and more on the outside of the shield and the signal current is more and more decoupled from the radio frequency current.

Such a decoupling of the signal current from the radio frequency current due to the skin effect is also observed in the signal line to be filtered. When the signal line is suitably constructed, for example as strip conductor in the proximity of a grounded surface, the radio frequency energy will be concentrated on the side of the signal line facing the grounded surface. The side of the signal line remote from the grounded surface is then, to a large extent, decoupled from radio frequency energy, such that the actual signal path can be continued here without being disturbed by radio-frequency energy. In the filter region the signal line or strip conductor is interrupted such that just a small cross-coupling of radio frequency energy into the processing region to be protected from radio frequency energy is possible. This results in reflection of radio frequency energy. Of course, the direct signal path in one and the same layer is also interrupted. The signal path is continued in another layer which is located on the side of the signal line remote from the grounded surface. Thus, the signal line to be filtered is located in a layer between the layer containing the grounded surface and the layer containing the signal continuation line. The continuation of the signal path in another layer is effected through one or several feed-throughs. Hereby, an "asymmetrical" skin effect is achieved in that the second conductor-containing layer is grounded, whereas there is no such grounded layer on the other side of the signal line, resultingly producing an asymmetric arrangement of the grounded conductor-containing layer in the vicinity of the signal line.

Preferably, the second and/or the third layer is a layer adjacent to the first layer. Thus, the grounded surface is located as closely as possible to the signal line to be filtered. The continuation of the signal path can also be effected in an adjacent layer. However, in order to achieve a better decoupling it can be advantageous to continue the signal path in a layer which is located farther away from the signal line to be filtered.

Behind the filter region the signal line can be continued again in the first layer. This is again effected by one or more feedtroughs. Then the signal line to be filtered is divided into three sections, namely two sections separated from each other in the first layer and a third section in the third layer.

In order to improve the filter effect the signal line to be filtered can comprises one or several capacitor surfaces in the filter region. These capacitor surfaces can be formed by enlargements of the signal line or the strip conductors.

In the case in which the protection of the processing region from radio frequency energy is not sufficient when using the described arrangement alone by making use of the skin effect, a combination of L- and/or C-filters can be used together with the described arrangement. Such L- and C-filters are known per se and, therefore, are not described in detail herein.

Inductances, for example in the form of discrete inducors or integrated coils (that means inductances realized by corresponding shape of strip conductors), can be provided in the third section. Capacitances can be arranged in front of or behind these inductances as seen in the direction of the signal flow. The integrated inductances are preferably arranged adjacent the surface, such that the effect thereof is as large as possible. Instead of inductances, also ohmic resistances can be used.

Usually, the printed circuit board in arranged in a housing having connectors. The measures described above are very effective when the radio frequency energy substantially or exclusively propagates on the signal line or in the feed lines from the connector of the housing to the strip conductors. If, however, it has to be assumed that the radio frequency energy also expands as radiation within the housing, then the region containing the radiation ("dirty" chamber) can be separated from the region to be protected ("clean" chamber) by means of a radio frequency shielding wall, which can be arranged in the filter region, in front of the filter region as well as behind the filter region.

Using the described arrangement based on the skin effect, it is possible to obtain an effective radio frequency filter throughout the range of 100 MHz and up to the GHz-range, because the skin effect is getting more and more effective when the frequency increases and the positive effect of the arrangement is maintained.

It is, of course, possible not only to filter one single signal line, but also to filter in the above described manner several signal lines, for example formed as strip conductors in one and the same layer or in different layers.

Further objects and features of the invention will be apparent to a person skilled in the art from the following specification of a preferred embodiment when read in conjunction with the appended claims.

BRIEF DESCRIPTION OF THE DRAWING

The invention and its mode of operation will be more clearly understood from the following detailed description when read with the appended drawing in which.

Throughout the drawings, the same elements when shown in more than one figure are designated by the same reference numerals.

DESCRIPTION OF THE PREFERRED EMBODIMENTS

Figure 1:
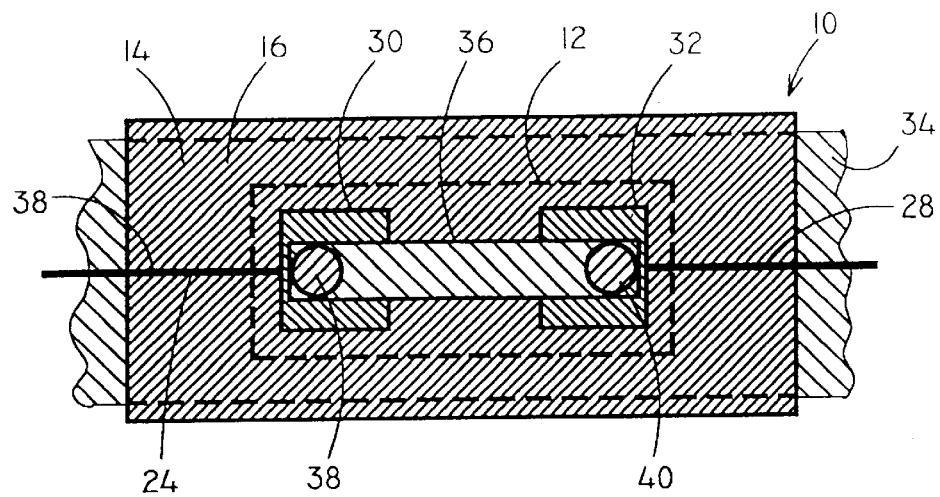
FIG. 1 is a schematic partly broken illustration and shows, in plan view, a first embodiment of a filter arrangement integrated in a printed circuit board for separating radio frequency energy from signal energy.
Figure 2:
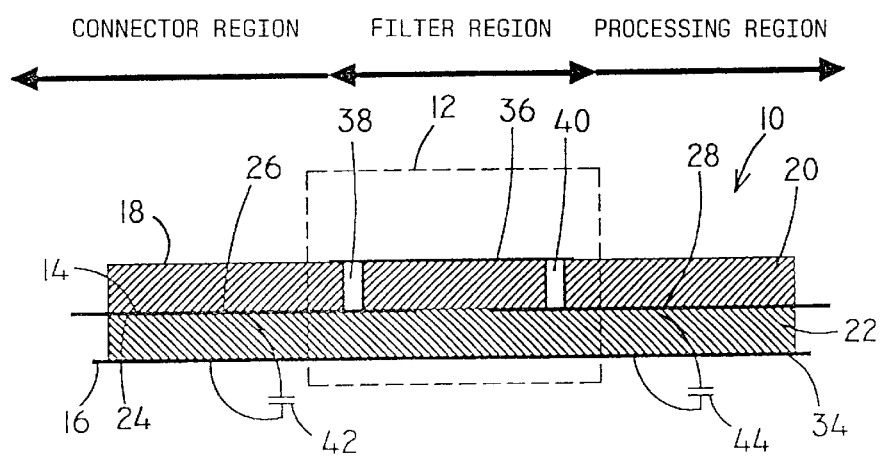
FIG. 2 is a schematic partly broken sectional illustration and shows the filter arrangement of FIG. 1 in a side view.

Referring to FIGS. 1 and 2, there is shown a first embodiment of a filter arrangement. Numeral 10 designates a printed circuit board. The printed circuit board 10 can be accommodated in a housing (not illustrated). The printed circuit board 10 (and possibly the housing) is divided into two separated regions by a filter arrangement 12 (filer region) integrated in the printed circuit board 10 an indicated by broken lines in FIGS. 1 and 2. The region of the printed circuit board 10 located to the left of the filter arrangement 12 in FIGS. 1 and 2 ("dirty" region or connector region) contains radio frequency energy, whereas the region located to the right of the filter arrangement 12 ("clean" region or processing region) is protected from radio frequency energy by the filter arrangement 12.

The printed circuit board 10 illustrated in FIGS. 1 and 2 has three adjacent layers 14, 16 and 18 which all are visible in FIG. 2. In FIG. 1 only the first and the second layers 14 and 16 are visible, the second layer 16 being shown as transparent in order to make the first layer 14 visible. The layers 14, 16 and 18 are electrically insulated from each other by insulating layers 20 and 22.

The signal flow in a signal line 24 to be filtered extends in the printed circuit board 10 from the left to the right in the FIGS. 1 and 2. The signal line 24 extends in the fist layer 14 as a strip conductor which is not continuous in the layer 14 but interrupted, such that the strip conductor in the layer 14 is divided into two sections 26 and 28 which are electrically separated from each other. The section 26 located in the "dirty" region represents the signal input line, the section 28 located in the "clean" region represents the signal output line of the filter arrangement 12. Each of the sections 26 and 28 of the strip conductor has a capacitor surface 30 and 32, respectively, in the filter region 12. In the illustrated embodiment the capacitor surfaces 30 and 32 are formed by enlargements of the sections 26 and 28 of the strip conductor in the filter region 12.

A grounded surface 34 is located in the second layer 16 located under the first layer 14 in FIGS. 1 and 2 in order to produce the so called "asymmetrical" skin effect. In the illustrated embodiment the grounded surface 34 is a totally or partly continuous surface. Thus, a plate capacitor 42 and 44, respectively, is each formed between the grounded surface 34 and the capacitor surfaces 30 and 32, respectively.

A third section 36 of the signal line 24 is located in the third layer 18 located above the first layer 14 in FIGS. 1 and 2. In the embodiment illustrated in FIGS. 1 and 2 this section 36 is formed as a short strip conductor. However, this section 36 can also comprise inductances or ohmic resistances. The third section 36 of the signal line 24 is electrically connected to the first and the second section 26 and 28. This is effected in known manner by the use of feed-throughs in the form of through pieces 38 and 40 which extend through the insulating layer 20. These through pieces can, for example, be realized by using blind hole technology or be normal feedtroughs, or just constitute the pad of a component.

Figure 3:
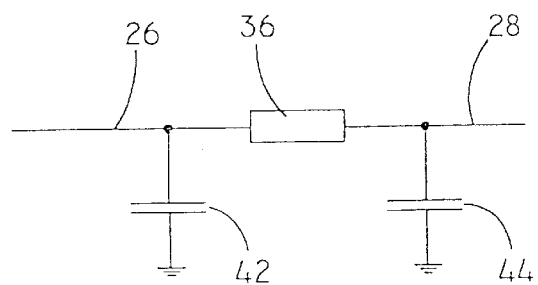
FIG. 3 shows the equivalent circuit diagram of the filter arrangement illustrated in FIGS. 1 and 2.

Referring now to FIG. 3, there is shown the equivalent circuit diagram of the filter arrangement illustrated in FIGS. 1 and 2 for better understanding of the filter effect in a signal path from the section 26 to the section 28 of the signal line. The circuit diagram comprises the two sections 26 and 28 of the signal line and the third section 36 as inductance. The two plate capacitors 42 and 44 represent the capacitor effect between the capacitor surfaces 30 and 32 and the grounded surface 34. From the circuit diagram it can be seen that radio frequency energy is filtered out in a signal path from the section 26 to the section 28. As can be seen from FIGS. 2 and 3 the illustrated filter arrangement acts symmetrically, such that the input and the output of the filter arrangement can be interchanged.

Figure 4:
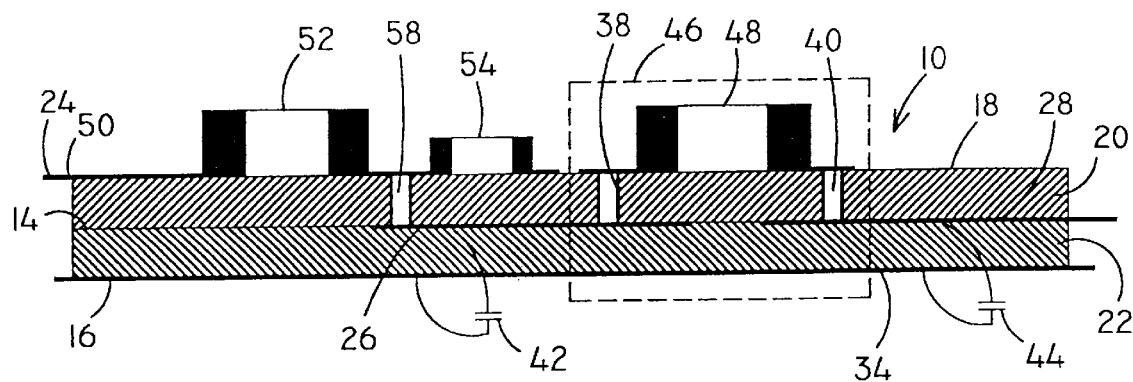
FIG. 4 is a schematic partly broken sectional illustration and shows, in plan view, a second embodiment of a filter arrangement integrated in a printed circuit board for separating radio frequency energy from signal energy.
Figure 5:
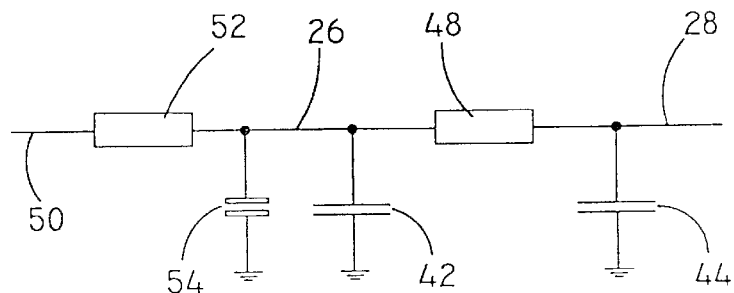
FIG. 5 shows the equivalent circuit diagram of the filter arrangement illustrated in FIG. 4.

Referring now to FIG. 4, there is shown a second embodiment of a filter arrangement, and FIG. 5 shows the corresponding equivalent circuit diagram. The filter arrangement illustrated in FIG. 4 differs from the filter arrangement illustrated in FIGS. 1 and 2 substantially in that it has additional discrete components. Corresponding elements are designated by the same reference numerals in FIGS. 4 and 5 as in FIGS. 1–3.

The portion 46 of the filter arrangement located to the right in FIG. 4 and indicated by dashed lines is almost identical to the filter arrangement 12 illustrated in FIGS. 1 and 2 and thus is not described once again. Compared to the filter arrangement 12 of FIGS. 1 and 2 the only difference is that the short strip conductor 36 in FIGS. 1 and 2 is replaced by a first inductor 48.

As in the first embodiment the region of the printed circuit board 10 located to the left of the filter arrangement in FIG. 4 ("dirty" region or connector region) contains radio frequency energy and the region located to the right of the filter arrangement ("clean" region or processing region) is protected from radio frequency energy by the filter arrangement.

The signal path in the signal line 24 to be filtered extends in the printed circuit board 10 from the left to the right in FIG. 4. The signal line 24 at first extends in the third layer 18 as a strip conductor 50. A second inductor 52 and a capacitor 54 are integrated in this strip conductor 50. The section of the strip conductor located to the left of the second inductor 52 represents the signal input line of the filter arrangement. The strip conductor 50 is grounded behind the capacitor 54. Between the second inductor 52 and the capacitor 54 the signal line is continued in a section 26 extending in the first layer 14. This section 26 corresponds to the section 26 of the first embodiment. However, the section 26 in FIG. 4 does not represent the signal input line of the filter arrangement as in FIGS. 2 and 3. Between the second inductor 52 and the capacitor 54, the strip conductor 50 extending in the third layer 18 is electrically connected to the section 26 of the signal line 24. This is effected in known manner through a feed-through in the form of a through piece 58 which extends through the insulating layer 20. The further path of the signal line 24 to the section 28 extending in the "clean" region as signal input line of the filter arrangement is described in connection with FIGS. 1 and 2.

The printed circuit board 10 illustrated in the FIGS. has three layers. However, the printed circuit board 10 may have more than three layers. In this case the shown signal lines, the grounded surfaces and the other filter components can be arranged in three layers which are adjacent to each other or not. Of course, it is also possible to filter more than one signal lines in the described manner in the printed circuit board 10.

If the printed circuit board is accommodated in a housing, the housing can be separated by means of a radio frequency shielding wall into a region containing the radiation ("dirty" chamber) and a region to be protected ("clean" chamber) in order to prevent the radio frequency energy to expand as radiation. This radio frequency shielding wall can be arranged in the filter region, in front of the filter region as well as behind the filter region.

I claim:

1. A filter arrangement for eliminating radio frequency energy from signal energy in a signal line comprising: a multi-layer printed circuit board with at least two adjacent insulating layers having inner and outer surfaces, said inner surfaces of said insulating layers facing each other, and three conductor-containing layers on said surfaces of said insulating layers, a second conductor-containing layer extending on the outer surface of a first one of said insulating layers; a first conductor-containing layer of said multi-layer printed circuit board extending between said inner surfaces of said insulating layers, said first conductor-containing layer forming an input section and an output section and a filter region arranged therebetween with two spaced ends, said input section having a surface facing said second conductor layer and an opposite surface remote from said second conductor-containing layer; a third one of said conductor-containing layers extending on the outer surface of the second one of said insulating layers and remote from said second conductor-containing layer; said third conductor-containing layer comprising a connecting section of said signal line; means being provided for connecting said ends of said interrupted signal line with said connecting section, said means contacting said first conductor-containing layer only at the surface thereof remote from said second conductor layer; said second conductor-containing layer being grounded, whereby radio frequency energy in said input section of said signal line is displaced, due to an asymmetrical skin effect, towards said surface of said input section facing said grounded second conductor-containing layer, and whereby the connecting means contacting said remote surface transmit, at least, reduced radio frequency energy to said connecting section and said output section of said signal line.

2. The filter arrangement of claim 1, wherein said second and/or third layer is a layer adjacent to said first layer.

3. The filter arrangement of claim 1, wherein said signal line to be filtered is continued again in said first layer behind said filter region, said signal line to be filtered defining said input and output sections which are separated from each other in said first layer, and a third section in said third layer.

4. The filter arrangement of claim 1, wherein said signal line to be filtered is comprises one or several capacitor surfaces in said filter region.

5. The filter arrangement of claim 3, wherein said third section of said signal line comprises inductances, capacitances and/or ohmic resistances.

6. The filter arrangement of claim 1, wherein said filter arrangement is selectively combined with an additional L-filter and C-filter for, respectively, filtering inductances and capacitances.

7. The filter arrangement of claim 1, further comprising a housing accommodating said printed circuit board and provided with a radio frequency shielding wall.

* * * * *